United States Patent [19]

White et al.

[11] Patent Number: 4,601,526
[45] Date of Patent: Jul. 22, 1986

[54] INTEGRATED CIRCUIT CHIP CARRIER

[75] Inventors: William J. White, Chelmsford, Mass.; James M. Ortolf, Acton; William R. Gordon, Burlington, all of Mass.

[73] Assignee: Honeywell Inc., Minneapolis, Minn.

[21] Appl. No.: 771,141

[22] Filed: Aug. 28, 1985

Related U.S. Application Data

[63] Continuation of Ser. No. 546,256, Oct. 28, 1983, abandoned.

[51] Int. Cl.⁴ .................. H01R 9/09; H01L 39/04
[52] U.S. Cl. ........................ 339/17 CF; 357/80; 361/396
[58] Field of Search ............ 339/17 CF, 17 M, 17 N, 339/17 LM; 361/393–396, 412, 413, 415; 357/80

[56] References Cited

U.S. PATENT DOCUMENTS

| | | | |
|---|---|---|---|
| 3,134,049 | 5/1964 | Kilby | 339/17 N |
| 3,297,974 | 1/1967 | Pittman | 339/17 CF |
| 3,370,203 | 2/1968 | Kravitz et al. | 361/394 |
| 4,052,118 | 10/1977 | Scheingold et al. | 339/17 CF |
| 4,239,312 | 12/1980 | Myer et al. | 339/17 N |
| 4,384,757 | 5/1983 | Andrews, Jr. et al. | 339/17 M |

OTHER PUBLICATIONS

Conductive Elastomeric, Technical Wire Products, Inc., Cranford NJ, 5-1974.

Primary Examiner—Neil Abrams
Attorney, Agent, or Firm—John S. Solakian; Albin Medved

[57] ABSTRACT

An integrated circuit chip carrier having miniaturized electrical input/output interconnectors, such that the area of the chip carrier may be matched or minimized with respect to the area of the integrated circuit. Such input/output interconnectors are reusable, such that the chip carrier may be easily removed and reconnected to a mother board assembly. Input/output interconnections as provided which when used allow an electro-optical integrated circuit to become in focus.

14 Claims, 10 Drawing Figures

INTEGRATED CIRCUIT CHIP CARRIER

The Government has rights in this invention pursuant to Contract No. FO4701-81-C-0035 awarded by the Department of the Air Force.

This application is a continuation of application Ser. No. 06/546,256, filed 10-28-83 now abandoned.

BACKGROUND OF THE INVENTION

The present invention generally relates to integrated circuit chip (IC) carrier connector assemblies, and more particularly to those assemblies requiring high chip density (i.e., a high number of chips per unit area) and ease of chip removability.

Most types of chip carriers used for mounting integrated circuits ("ICs") to other assemblies require a substrate area larger than the IC itself in order to accommodate input and output ("IO") connection mechanisms to the IC. In part, this has been the case because of the low pin densities achievable using current technologies. In the past, standard mounting assemblies have included dual and single in-line packaging types (commonly referred to as "DIPs" and "SIPs", respectively) and more recently pin grid array packages and leadless chip carriers having interconnection pads that are reflow soldered or are socketed around their perimeter.

In IC mounting assemblies, it is often desirable to reduce the size of the chip carrier and interconnection mechanism such that the ratio of chip carrier substrate to IC area is as small as possible. This is particularly important in electro-optical devices, where chips bearing optically sensitive ICs must be closely spaced over an area, as well as other devices where high chip density is required for low total volume and weight, such as space borne applications. The packing efficiency of such chip carrier assemblies is often measured in terms of I/O channels (e.g., pins or pads) per chip carrier area. Current DIP or pin grid array chip carriers maximally hold about 30 to 70 IOs per square inch, while the area of the substrate supporting the IC and interconnect assembly range from approximately 12 to 16 times larger than that of the IC itself.

Such IC chip carrier devices generally use either solder or some mechanical closing device to affix the chip carrier to the mother board or other assembly. These connecting schemes have the disadvantage that they are either bulky, requiring an increase in the area of the chip carrier required to support the IC, or that they are difficult to remove and reconnect.

It is, accordingly, a primary object of the present invention to provide an improved integrated circuit chip carrier apparatus where the area taken by the chip carrier may be as small as that of the chip itself, and where the chip carrier may be easily detached and reconnected to a higher level assembly.

SUMMARY OF THE INVENTION

The above and other objects of the present invention are achieved by providing a chip carrier mounting surface substantially matched to the IC in size, in which:

(1) the chip carrier body and internal connectors are made using standard cofired buried lead ceramic construction, or multiple film screening chip carrier construction techniques;

(2) the IC is fastened to the chip carrier with a suitable adhesive, for example, solder or epoxy;

(3) the electrical contacts between the IC and chip carrier connectors are made using standard backside contacting, and/or standard wire or cable bonding techniques; and (4) the interconnects between chip carrier and mother board are made by standard single chip contact techniques, for example, by epoxy die bonding, pressure pads, miniature pin and socket pairs, or by spring finger connectors.

A small mechanical fastener, for example, a screw and threaded sleeve assembly, may be used to secure the chip carrier to the mother board and to insure adequate contact pressure between the chip carrier and the mother board, as required. In cryogenically cooled devices the screw sleeve materials may be selected to increase contact pressure as the device temperature is lowered.

The present invention has the advantage that the interconnections from the chip carrier to the mother board are made behind, rather than adjacent to the IC, such that the ICs can be positioned side by side with no lost space. Second, the chip carriers are easily removable and replaceable without additional soldering or other rework of the chip carrier. Finally, the subject invention has the advantage that it can be used in many types of semiconductor devices, including infrared detector assemblies which may or may not use charge coupled devices, and other cryogenically cooled devices.

BRIEF DESCRIPTION OF THE DRAWINGS

The above and other objects of the present invention are achieved in the illustrative embodiments as described with respect to the figures in which.

DETAILED DESCRIPTION OF THE PREFERRED EMBODIMENT(S)

Figure 1:
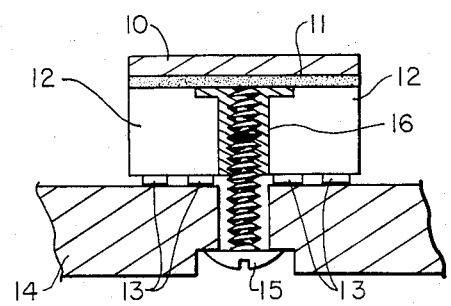
FIG. 1 shows a side view of the subject invention.

Referring to FIG. 1, the device of the present invention includes an integrated circuit 10, chip carrier 12 matched in size to integrated circuit 10, adhesive 11 for attaching integrated circuit 10 to carrier 12, an electrical interconnector 13 between carrier 12 and mother board 14, and a screw 15 and threaded sleeve 16 for attaching chip carrier 12 to board 14.

Figure 3A:
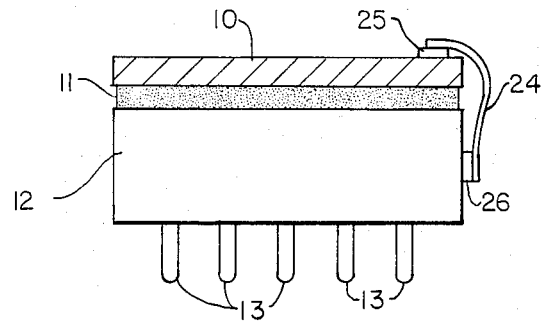
FIGS. 3A and 3B show side cross-sectional views of a top-to-side interconnected integrated circuit to carrier chip interconnect mechanism comprising the subject invention.
Figure 3B:
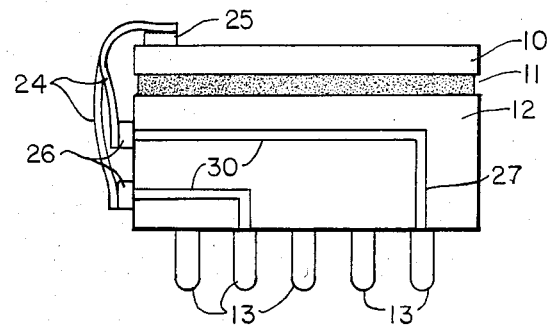
Figure 4A:
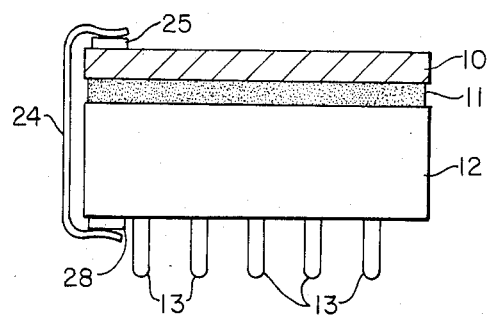
FIGS. 4A and 4B show side and bottom views, respectively, of a top-to-bottom interconnected integrated circuit to carrier chip interconnect mechanism comprising the subject invention.

FIGS. 3A and 3B show preferred configurations for electrical connector 13, which provide electrical connection between integrated circuit 10, through chip carrier 12, to mother board interconnectors 13. Flexible conductive wires 24 connect contact pads 25 on the integrated circuit 10 to contact pads 26 on the side of the chip carrier 12. Conductive pads 26 or 28 (as shown in FIG. 4A) are connected to the appropriate mother board interconnects 13 by vertical vias 27 and horizontal conductor pads 30 embedded in the body of carrier 12 as shown in FIG. 3B. Vias 27 and conductors 30 may be fabricated by standard cofired buried lead ceramic integrated circuit construction, multiple film screening, or other well-known techniques. It should be understood that vias 27, conductors 30 and wires 24 are shown, for ease of illustration, to be larger than they actually are in proportion to the carrier 12.

Figure 4B:
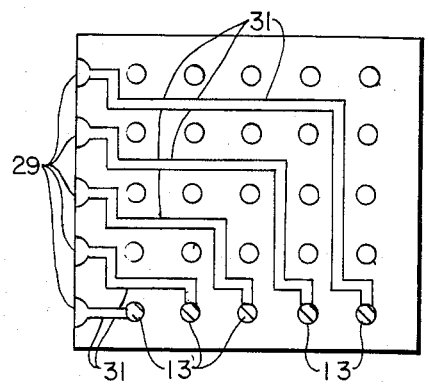

In an alternate embodiment shown in FIGS. 4A and 4B, flexible cable or wires 24 connect contact pads 25 on integrated circuit 10 to contact pads 28 on the base of carrier 12. Connection between pads 28 and interconnects 13 are constructed by thick or thin film deposition of conductive contact strips 31 on the base of carrier 12, thus substituting for the buried lead ceramic construction. Half-vias 29 may be substituted for contact pads 28, where desired.

Figure 5:
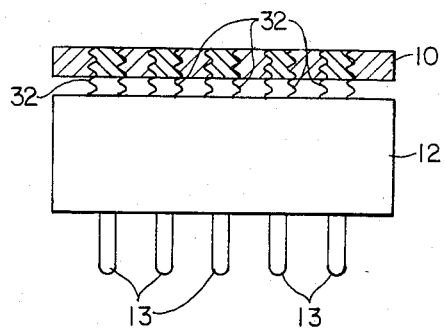
FIG. 5 shows a side view of a backside contact integrated circuit to carrier chip mechanism comprising the subject invention.

FIG. 5 shows a third preferred method of connection of integrated circuit 10 to carrier 12. In this embodiment, adhesive layer 11 is replaced by conductive contacts 32 which may consist of reflow or compression solder bumps or conductive epoxy dots. These contacts 32 connect the IC 10 to interconnects 13 through standard buried electrical paths in carrier 12 as described above, or in the alternate, by use of the thick or thin film embodiment of FIG. 4.

FIGS. 2A, 2B, 2C and 2D show alternate forms which electrical interconnector 13 may take in order to make electrical contact between the buried or thick film contacts at the base of carrier 12 and the electrical contacts on mother board 14.

Figure 2A:
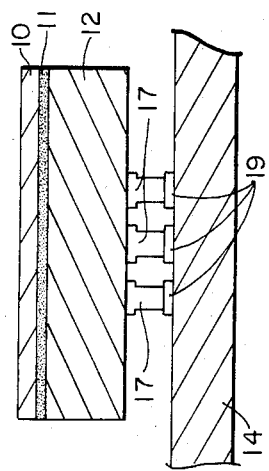
FIGS. 2A, 2B, 2C and 2D show side views of alternate carrier chip to mother board interconnect mechanisms of the subject invention.

As shown in FIG. 2A, raised conductive pads 17 on the base of carrier 12 contact flat conductive pads 19 on the mother board 14, which can be connected to the desired electronic assembly. This method of electrical connection has been employed for creating tape cable interconnects.

Figure 2B:
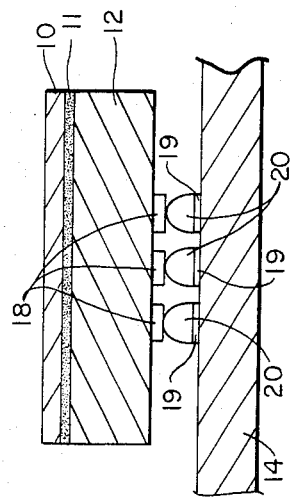

A second form of interconnector 13 is shown in FIG. 2B. Contact is made between flat contact pads 18 on the carrier 12, and flat contact pads 19 on the mother board 14 via epoxy dot contacts 20 situated on pads 19. Epoxy contacts 20 may be fabricated using the epoxy die bond method, a technique well-known in the art of single contact integrated circuit packaging.

Figure 2C:
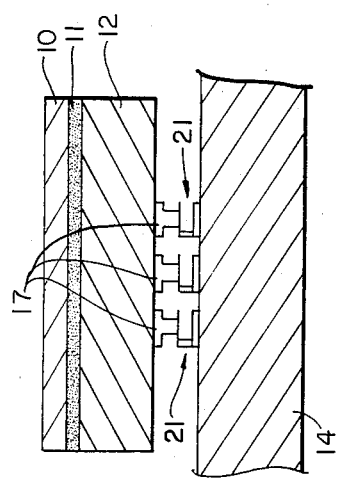

FIG. 2C shows a third form of interconnector 13 which utilizes bump and spring finger interconnects. Conductive pad and bumps 17 are affixed to the base of chip carrier 12 to contact the buried or thick film contacts in the carrier 12. The spring finger connectors 21 are described in a patent application entitled "Spring Finger Interconnect For IC Chip Carrier", Ser. No. 546,257, filed on Oct. 28, 1983, and assigned to the same assignee as that of the present invention. It provides both a means of contact with electrical leads of mother board 14, and a means of accurate height registration of the integrated circuit 10 above a defined reference plane, as required when electro-optical devices are mounted on the integrated circuit 10.

Figure 2D:
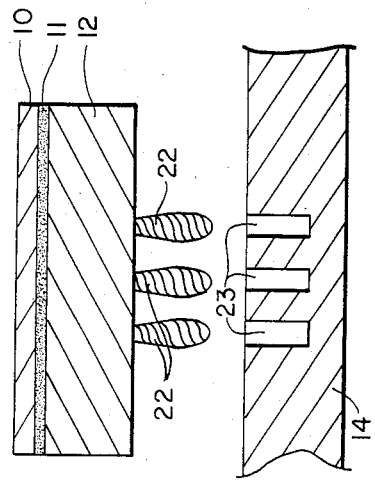

FIG. 2D shows a fourth form of electrical interconnector 13, which utilizes twisted wire pin 22 and socket 23 pairs, to give a compressive contact. In the past, this twisted wire pin technology has been applied to the manufacture of wire cable interconnects, and not to chip carrier interconnects.

Referring to FIG. 1, all of the above four forms of interconnector 13 have the advantage that they provide a means of accurate height registration of the integrated circuit 10 above the recipient mother board assembly 14. A further advantage of these forms of interconnector 13 is that an integrated chip carrier may be constructed which possesses I/O port density of approximately 400 IOs per square inch. Where interconnector 13 comprises a spring finger connector 21, epoxy dot contacts 20 or raised conductive pads 17, the present invention has the additional advantage that the position of chip carrier 12 may be laterally adjusted as required where integrated circuit 10 includes an optical detection device.

Having described the invention, what is claimed as new and novel and for which it is desired to secure Letters Patent is:

1. An integrated circuit chip carrier and electrical connector assembly apparatus comprising:
   (A) a miniature electrical circuit for processing signals, said circuit having active components encompassed in a first area, said first area in the shape of a wafer having a bottom, top and sides;
   (B) a plurality of first electrical contact pads located on said top of said circuit, said first electrical contact pads connected to different ones of said active components of said circuit;
   (C) a first assembly substantially matched in size to said first area of said circuit, said first assembly having a top surface and a bottom surface which said surfaces are located within the boundaries of said first area, said first assembly also having side surfaces, said first assembly having good insulating properties;
   (D) a plurality of second electrical contact pads located on at least one of said side surfaces of said first assembly;
   (E) a second assembly having a top surface, said second assembly having good insulating properties;
   (F) means for bonding said bottom of said wafer shaped first area of said circuit to said top surface of said first assembly;
   (G) a plurality of electrical leads attached between said first electrical contact pads and said second electrical contact pads, said electrical leads physically positioned from their points of attachment to said first pads above and overlying the top of said circuit down along at least one of said sides of said circuit;
   (H) a first electrical input/output interconnector means comprising a pattern of electrical contacts, said first interconnector means attached on said bottom surface of said first assembly;
   (I) a plurality of electrical circuit paths connected between said second electrical contact pads and said electrical contacts, said electrical circuit paths physically routed through said first assembly;
   (J) a second electrical input/output interconnector means having a pattern of electrical contacts which have a mating capability to said contacts on said first interconnector means, said second interconnector means attached on said top surface of said second assembly; and
   (K) means for enabling electrical connection between said first and said second electrical input/output interconnector means in a manner such that said first and second interconnector means are easily removable and reconnectable.

2. Apparatus as described in claim 1 wherein said first and second electrical interconnector means comprise patterned conductive bumps and matching conductive pads, respectively.

3. Apparatus as described in claim 1 wherein said first and second electrical interconnector means comprise matched conductive pin and socket pairs, respectively.

4. Apparatus as described in claim 1 wherein said first and second electrical interconnector means comprise matched conductive pads, wherein each of said matched conductive pads comprise a curable conductive epoxy.

5. Apparatus as described in claim 1 wherein said first electrical interconnector means comprises a pattern of conductive bumps and wherein said second electrical interconnector means comprises a matched set of spring finger contacts.

6. Apparatus as described in claim 1 wherein said means for enabling comprises means for mechanically connecting said first assembly with said second assembly.

7. Apparatus as described in claim 6 wherein said means for mechanically connecting comprises a screw or similar device coupled through said second assembly and secured into said first assembly on which said integrated circuit is bonded whereby said first assembly is easily removable and reconnectable with said second assembly.

8. Apparatus as described in claim 7 wherein said first assembly comprises a first material and wherein said means for mechanically connecting comprises a second material so that the expansion and contraction characteristics of said materials will cause said first and second assemblies to maintain electrical contact when at cryogenic temperatures.

9. Apparatus as described in claim 6 wherein said integrated circuit is an electro-optical device and wherein said apparatus includes height control means for enabling accurate height registration of said electro-optical device when secured by means of said means for mechanically connecting, whereby said electro-optical device may be focused on a scene of interest.

10. Apparatus as described in claim 1 wherein said first and second electrical interconnector means comprise matched conductive pin and socket pairs, respectively, wherein said conductive pins are made using twisted wire.

11. Apparatus as described in claim 1 wherein said electrical connection made between said first and second interconnector means is not made by soldering, brazing or similar techniques.

12. Apparatus as in claim 9 wherein said height control means includes said means for mechanically connecting, said first interconnector means and said second interconnector means such that said first and second interconnector means become, by said means for mechanically connecting, in electrical contact with increasing pressure so as to cause said electro-optical device to be adjusted in height.

13. Apparatus as in claim 12 wherein said second assembly has an opening and wherein said height control means includes a screw and threaded sleeve, said sleeve attached to said first assembly and said screw arranged to pass through said opening to engage said sleeve.

14. An integrated circuit chip carrier and electrical connector assembly apparatus comprising:
(A) a miniature electrical circuit for processing signals, said circuit having active components encompassed in a first area, said first area in the shape of a wafer having a bottom, top and sides;
(B) a plurality of first electrical contact pads located on said top of said circuit, said first electrical contact pads connected to different ones of said active components of said circuit;
(C) a first assembly substantially matched in size to said first area of said circuit, said first assembly having a top surface and a bottom surface which said surfaces are located within the boundaries of said first area, said first assembly also having side surfaces, said first assembly having good insulating properties;
(D) a plurality of second electrical contact pads located on said bottom surface of said first assembly;
(E) a second assembly having a top surface, said second assembly having good insulating properties;
(F) means for bonding said bottom of said wafer shaped first area of said circuit to said top surface of said first assembly;
(G) a plurality of electrical leads attached between said first electrical contact pads and said second electrical contact pads, said electrical leads physically positioned from their points of attachment to said first pads above and overlying the top of said circuit down along at least one of said sides of said circuit to the bottom surface of said first assembly;
(H) a first electrical input/output interconnector means comprising a pattern of electrical contacts, said first interconnector means attached on said bottom surface of said first assembly;
(I) a plurality of electrical circuit paths connected between said second electrical contact pads and said electrical contacts, said electrical circuit paths physically routed on said bottom surface of said first assembly;
(J) a second electrical input/output interconnector means having a pattern of electrical contacts which have a mating capability to said contacts on said first interconnector means, said second interconnector means attached on said top surface of said second assembly; and
(K) means for enabling electrical connection between said first and said second electrical input/output interconnector means in a manner such that said first and second interconnector means are easily removable and reconnectable.

* * * * *